United States Patent
Usach Merino et al.

(10) Patent No.: US 10,097,200 B1
(45) Date of Patent: Oct. 9, 2018

(54) RESYNCHRONIZATION OF SAMPLE RATE CONVERTERS

(71) Applicant: Analog Devices Global, Hamilton (BM)

(72) Inventors: Miguel Usach Merino, Valencia (ES); Michael Hennessy, Limerick (IE); Anthony Evan O'Shaughnessy, Glounthaune (IE); Claire Croke, Aherla (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/593,981

(22) Filed: May 12, 2017

(51) Int. Cl.
| | |
|---|---|
| *H03M 1/10* | (2006.01) |
| *H03M 3/00* | (2006.01) |
| *H03M 1/12* | (2006.01) |
| *H03M 1/00* | (2006.01) |
| *H04L 7/00* | (2006.01) |
| *H04B 14/04* | (2006.01) |
| *H04L 25/03* | (2006.01) |

(52) U.S. Cl.
CPC ......... *H03M 3/458* (2013.01); *H03M 1/1245* (2013.01); *H03M 3/344* (2013.01); *H03M 3/384* (2013.01); *H03M 1/00* (2013.01); *H03M 1/12* (2013.01); *H03M 2201/4233* (2013.01); *H04B 14/046* (2013.01); *H04L 7/0008* (2013.01); *H04L 25/03343* (2013.01)

(58) Field of Classification Search
CPC .. H03M 1/12; H03M 2201/4233; H03M 1/00; H04B 14/046; H04L 25/03343; H04L 7/0008

USPC ........ 341/120, 166, 155, 165; 375/243, 254, 375/354

See application file for complete search history.

(56) References Cited

U.S. PATENT DOCUMENTS

| 9,432,043 B2 | 8/2016 | O'Shaughnessy et al. |
|---|---|---|
| 2006/0284753 A1 | 12/2006 | Gangstoe et al. |
| 2010/0090876 A1* | 4/2010 | Taft ..................... H03M 1/0624 341/166 |
| 2015/0263759 A1 | 9/2015 | Marienborg et al. |

OTHER PUBLICATIONS

"Synchronizing the ADS1271", Texas Instruments—Application Report SBAS355, (Oct. 2005), 8 pgs.

(Continued)

*Primary Examiner* — Joseph Lauture
(74) *Attorney, Agent, or Firm* — Schwegman Lundberg & Woessner, P.A.

(57) ABSTRACT

A device having a sample-rate converter that may be programmed to generate samples at different rates is synchronized to an external synchronization pulse by temporarily changing the sample rate to a temporary sample rate and then changing the sample rate back to the original sample rate. Synchronization in a reduced amount of time is achieved by determining the interval between the synchronization pulse and one of the output samples and determining a processing time of the device for generating the output samples at a new rate. The system calculates a temporary sample rate based on these calculations that tends to reduce an amount of time to achieve synchronization.

20 Claims, 5 Drawing Sheets

(56) References Cited

OTHER PUBLICATIONS

O'Shaughnessy, Anthony, et al., "Coherent Sampling for Power Quality Measurements Using the AD7779 24-Bit Simultaneous Sampling Sigma-Delta ADC", Analog Devices AN01388 Application Note, (2016), 6 pgs.

Pisani, Brian, "Accounting for delay from multiple sources in delta-sigma ADCs", Texas Instruments, (2016), 8 pgs.

* cited by examiner

RESYNCHRONIZATION OF SAMPLE RATE CONVERTERS

FIELD OF THE DISCLOSURE

This disclosure concerns apparatus and a method for synchronizing a device having a sample rate converter to an external synchronization pulse and in particular, apparatus for synchronizing decimated digital samples provided by a sigma-delta modulator.

BACKGROUND

In many systems it is desirable to use analog-to-digital converters (ADCs) to sample the output signals of one or more devices in order to monitor the performance of the devices. A given system may monitor output signals of several devices. In order to accurately know the instantaneous state of the system, it is desirable for the output signals of all of the devices to be synchronized.

Many installations use ADCs having internally generated clock signals that may, over time, become misaligned. In order to accurately know the state of the devices, the system may periodically apply a common synchronization pulse to all of the devices to bring them into mutual synchronization.

SUMMARY OF THE DISCLOSURE

A device that synchronizes timing of its output samples to a pulse of a synchronization signal SYNC receives samples at an input sample rate, $F_S$ hand provides output samples at an output data rate ODR where ODR is less than $F_S$. The device includes a programmable decimator and timer circuitry that is configured to receive the SYNC pulse and the pulses of the signal DRDY and to determine a delay between the synchronization pulse and a selected one of the DRDY pulses. The device calculates a temporary decimation factor corresponding to a temporary output sample rate $ODR_{TEMP}$, based on the determined delay and a processing time of the device. The device applies the temporary decimation factor to the programmable decimator to change the output data rate from ODR to $ODR_{TEMP}$. After a decimation factor delay, the device to change the output sample rate back to ODR.

In one embodiment, the processing time and the decimation factor delay are determined by the device and the programmable decimator.

In one embodiment, the device includes a sigma-delta modulator circuit having a filter and the processing time includes a group delay of the filter.

In one embodiment, the filter is an $N^{th}$ order sinc filter, where N is an integer, the decimation factor delay includes N periods of ODR.

In one embodiment, the sigma-delta modulator is part of a sigma-delta analog-to-digital converter (ADC) circuit and the processing time is a sum of the group delay of the filter and a calibration delay of the ADC and the filter.

In one embodiment, the interval is measured from a transition of the SYNC pulse to a corresponding transition of a next occurring DRDY pulse and $ODR_{TEMP}$ is less than ODR.

In one embodiment, the interval is measured from a transition of one of the DRDY pulses occurring immediately before the SYNC pulse to a corresponding transition of the SYNC pulse and $ODR_{TEMP}$ is greater than ODR.

According to another embodiment, a method for synchronizing output samples provided by a device, including a programmable decimator, where the samples are provided at an output sample rate ODR to a synchronization pulse, SYNC. The method measures an interval between the SYNC pulse and one of the DRDY pulses. The method determines a temporary decimation factor corresponding to temporary output sample rate, $ODR_{TEMP}$, and a decimation factor delay to change output sample rates based on the measured interval a processing time of the device for generating the output samples. The method applies the temporary decimation factor to the programmable decimator to change the output data rate to $ODR_{TEMP}$, and, after the decimation factor delay, change the decimation factor to change the output data rate to ODR.

DETAILED DESCRIPTION

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail. Furthermore, features of the drawings are not to scale but may be expanded or contracted to illustrate the disclosed embodiments.

Synchronizing multiple sigma-delta ADCs to a common synchronization pulse may result in a prolonged interval with no valid samples. The most common way to synchronize a sigma-delta ADC is to reset the digital processing hardware of the ADC. Sigma-delta ADCs continuously sample the input signal and digitally process output signals of a sigma-delta to generate the output conversion samples. The generation of valid conversion samples occurs only after a predetermined number of modulator output samples have been processed.

The digital processing removes high frequencies, and minimizes noise, typically by averaging samples to generate high resolution conversion samples. Optionally, the digital processing may also calibrate the conversion samples by compensating for offset and gain introduced in the conversion process.

One method of synchronization is to control the point when the digital processing of an acquisition board starts to average samples, some sigma-delta ADCs include a feature, typically implemented in an external pin, to reset the digital signal processing. In distributed systems, a synchronization signal provided by a master acquisition board synchronizes all of the acquisition boards to the master board.

Each acquisition board is configured to operate independently, that is to say, in response to an internally generated clock signal. To guarantee the correct synchronization, however, the acquisition boards may share a common synchronization signal generated by the master acquisition board, for example, once per second, such as is provided, for example, by a GPS system. Ideally, the local clock signal is aligned to be synchronous with the synchronization signal, but more importantly, the master board synchronizes the sigma-delta processors so that the modulator samples provided by each of the sigma-delta converters of all of the acquisition boards are aligned with the synchronization signal.

Figure 1:
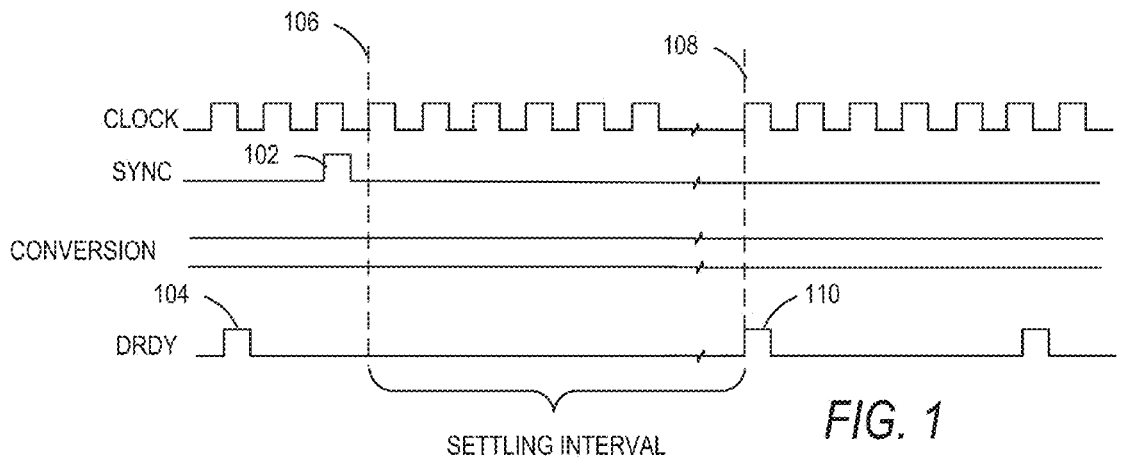
FIG. 1 is a timing diagram that shows one method of synchronizing a sigma-delta ADC.

One method of synchronization involves resetting the digital processing hardware of each acquisition board when the synchronization signal is not aligned with the output clock signal of the acquisition board. When a sigma-delta ADC is synchronized by resetting the digital processing hardware, however, there is a penalty in time until the digital processing hardware processes a sufficient number of input samples to generate a valid conversion sample. This is referred to as the settling time. FIG. 1 shows a timing diagram for a typical sigma-delta ADC that has been synchronized using a reset pulse that resets the digital processing hardware. As shown, the reset pulse 102 causes a reset operation to begin at time 106. Because the digital processor is reset, the digital processing (e.g. sinc filtering of the output samples of the ADC) restarts and the sigma-delta ADC experiences a relatively long settling time e.g. 20, 30 or more pulses of the data ready output clock, DRDY, until a valid conversion sample is ready at time 108, coincident with a leading edge of the DRDY pulse 104. It is noted that the timing diagrams are not to scale. The clock signal CLOCK typically has a frequency much greater than the frequency of the output clock signal DRDY, on the order of between 100 to 1000 times greater. Furthermore, it is noted that, while the examples below are described in terms of using respective leading edges of the signals DRDY and SYNC as reference points, it is contemplated that any other common reference, such as the trailing edge, or a fixed delay (e.g. 1-10 pulses of the signal $F_S$ or a fixed interval determined by a single-shot monostable multivibrator) from corresponding signal edges may be used to measure the interval between DRDY and SYNC or between SYNC and DRDY. Such a fixed delay may be used, for example, to prevent false triggering due to noise in the SYNC and/or DRDY signals.

The examples presented below describe a solution based on the use of a sample rate converter, but could be extrapolated to any other digital processor implementation that provides fine tuning capabilities in the number of modulator samples that are digitally processed so that no dynamic spurs (e.g. glitches), or saturation events occur when the number of samples is modified. The example digital processing includes a programmable decimator that provides for on-the-fly update of a decimation factor.

The examples described below measure a time difference between the external synchronization signal and the output clock pulse of the sigma-delta ADC. Based on this measurement, the processor causes the sample rate converter to temporarily adjust the decimation rate to compensate this time difference. The processor then causes the sample rate converter to revert to its original rate so that, when the conversion to the original rate is complete, the ADC will be synchronized to the synchronization signal.

Figure 2:
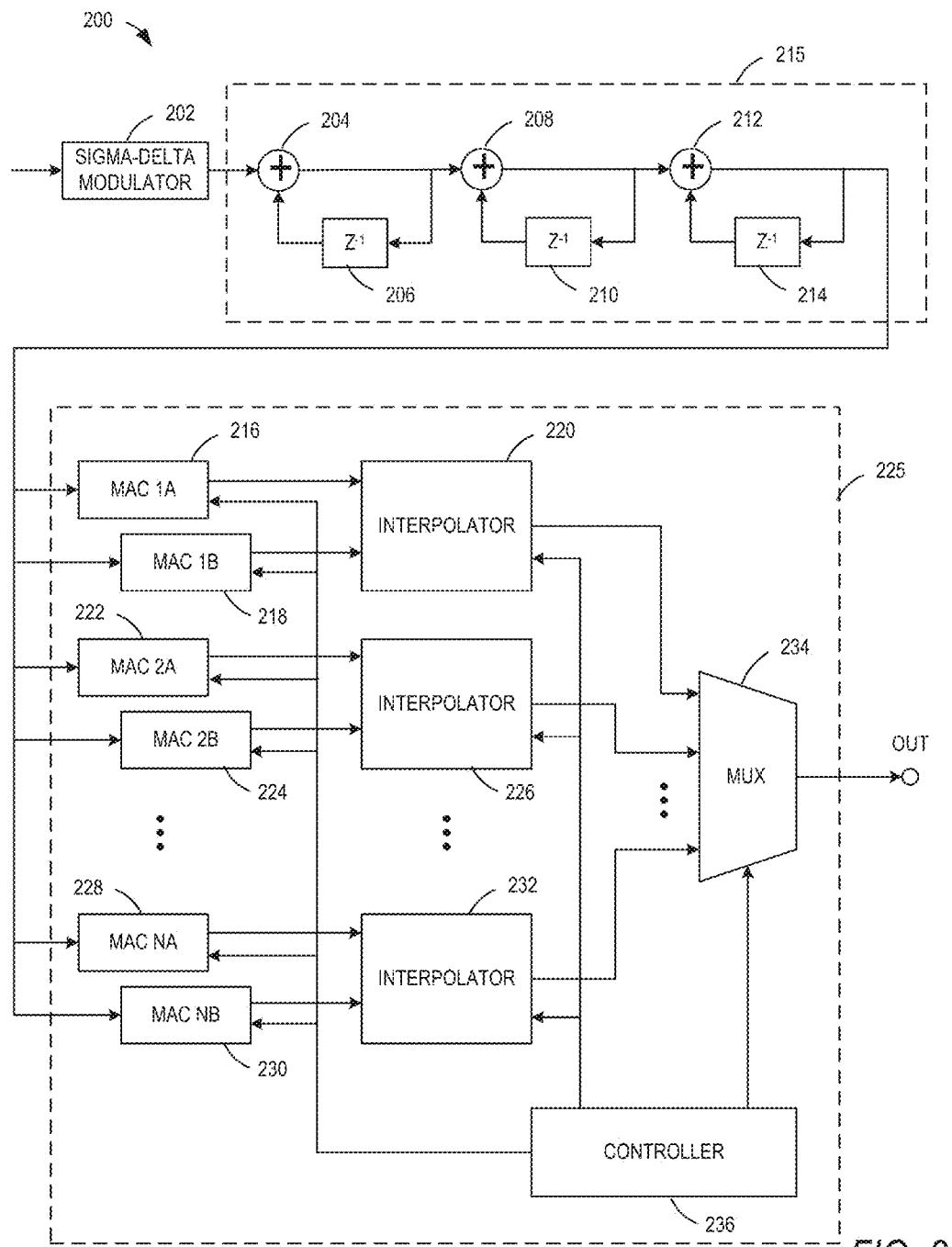
FIG. 2 is a block diagram of an example sigma-delta ADC.

FIG. 2 shows an example sigma-delta ADC 200 that includes a sigma-delta modulator 202, third-order sinc filter including a third-order integrator stage 215, and a circuit 225 that includes multiple parallel third order differentiators and a sample rate converter. The circuit shown in FIG. 2 is described in U.S. Pat. No. 9,432,043. As described in the examples below, the sample rate converter may be a programmable decimator that operates by changing the decimation factor, allowing the input sample frequency, $F_S$, to remain unchanged. The third-order sinc filter is exemplary only. The sigma-delta ADC may be implemented using filters having larger or smaller orders.

The sigma-delta modulator 202 is driven at the input sample rate $F_S$ which is greater than the output sample rate of the ADC 200 by the decimation factor. The sigma-delta modulator 202 outputs one or more pulse trains at the clock frequency $F_S$ to one or more inputs of the integrator stage 215. For the sake of simplicity only a single signal path has been shown between the sigma-delta modulator 202 and the integrator stage 215. It is understood, however, that the signal path may include multiple data paths each providing samples at the sampling frequency $F_S$. The example integrator stage 215 includes three cascade-connected integrators. The first integrator includes summing circuit 204 and delay element 206, the second integrator includes summing circuit 208 and delay element 210, the third integrator includes summing circuit 212 and delay element 214. Each of the summing circuits 204, 208 and 212 may include a modulo arithmetic adder having a respectively larger modulus. An output of the integration block 16, which may now be a multibit word is provided to the circuit 225.

Circuit 225 includes multiple multiply-accumulator circuits 216, 218, 222, 224, 228 and 230; interpolators 220, 226 and 232; and controller 236. As described in the above-referenced patent, each multiply-accumulator circuit implements a third order finite impulse response (FIR) differentiation filter which, when the sinc filter has a decimation factor of 100 may be described by equation (1).

$$\text{Output} = -1Z^{300} + 3Z^{-200} - 3Z^{-100} + 1 \quad (1)$$

Each multiply accumulator, therefore, implements a third order differentiator having a decimation factor of 100 to 1. The delays used by the FIR filter are changed to change the decimation factor of the programmable decimator. The multiply-accumulators are arranged in pairs, including an "A" multiply-accumulator and a "B" multiply-accumulator. In this arrangement the first channel is implemented as two multiply-accumulators 216 and 218, which may be regarded as sub-channels within a channel. FIG. 2 shows N pairs of multiply-accumulators. In the examples described below, N=3 because each multiply accumulator implements a third-order differentiator. It is contemplated, however, that larger or smaller values of N may be used based on the order of the differentiator.

Each multiply-accumulator in each pair of multiply-accumulators is connected to a combining circuit, such as an interpolator 220, which combines the outputs of the multiply-accumulators in a weighted manner. The weighting is adjustable in response to the controller 236. Such an arrangement allows fractional decimation values to be synthesized. Suppose, for example, that the integrator stage 215 outputs words at the input sample rate $F_S$, and that each word is identified by an index P. The sample rate converter may receive a command to decimate by a factor of M as it starts this process upon receipt of a word $P_E$, where E is an integer. The decimation factor M, however, may be a non-integer number, which can be divided up into an integer part I and a fractional or decimal part D. If, for example, M=233.33, then I=233 and D=0.33. The controller 236 loads the value I as the decimation factor into the first multiply-accumulator 216. Similarly the controller 236 loads the same decimation factor I into the second multiply-accumulator 218 of the first pair of multiply-accumulators.

The controller 236, however, controls the multiply-accumulators 216 and 218 such that they operate on samples provided by the integrator stage 215 that are temporally offset from one another by one period of the sample frequency $F_S$. Loading the channels with the same decimation factor I means that the channels maintain synchronism, i.e., the offset of one word, irrespective of how many output words they provide. The outputs of the two multiply accumulators 216 and 218 are combined at the interpolator 220 in a weighted fashion.

The interpolator 220 receives the value D from the controller 236. The interpolators 220, 226 and 232 implement any of several interpolation methods. In one example, each of the interpolators is a bilinear interpolator which generates the interpolated value according to equation (2).

$$\text{Output} = S1 + (S2 - S1)D \quad (2)$$

where S1 and S2 are consecutive samples provided by the integrator stage 215 at the sample rate $F_S$.

The description of the operation of the first channel, including first pair of multiply accumulators 216 and 218 and the interpolator 220, applies to the second channel, including the second pair of multiply accumulators 222 and 224 and the interpolator 226, and to the third channel which includes the third pair of multiply accumulators 228 and 230 and the interpolator 232. The samples processed by the second and third channels are offset by I and 2*I samples, respectively, with respect to the samples processed by the first pair of multiply-accumulators 216 and 218. The multiplexer 234 selects output samples provided by the respective channels at times determined by the controller 236. Thus, each of the multiply-accumulators 222, 224, 228 and 230 includes a variable delay element (not shown) which is controlled by the controller 236.

Figure 3:
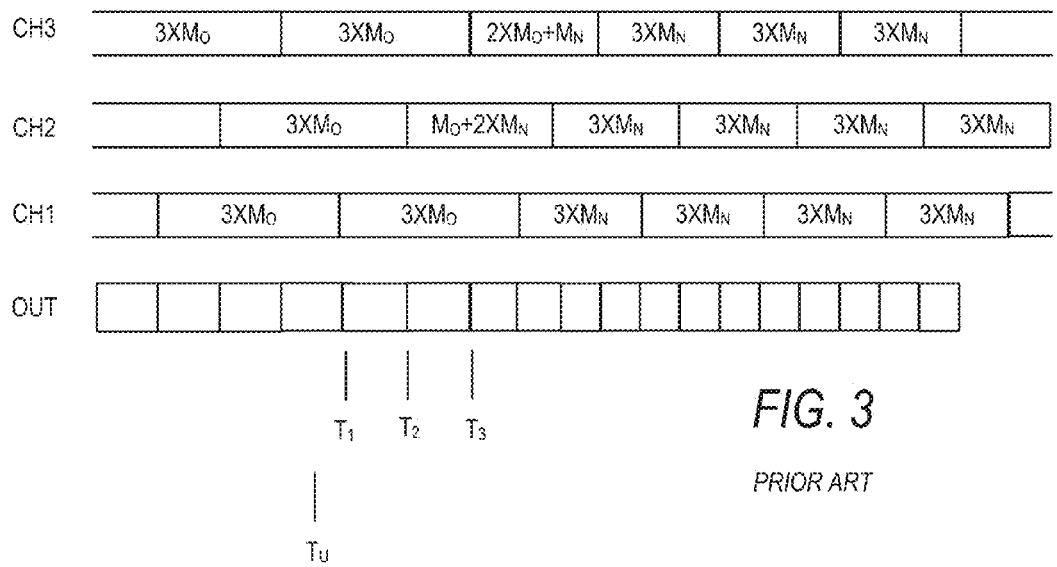
FIG. 3 is a timing diagrams that illustrates the operation of the sigma-delta ADC shown in FIG. 2.

FIG. 3 shows a timing diagram in which in which the first to third channels (i.e. first to third pairs of multiply-accumulators) are operating with a decimation factor $M_O$ such that each channel takes $3*M_O$ sample times to perform a third order sinc function. The decimation factor is updated at time $T_U$ to $M_N$. In this example the first channel to complete its calculation is CH1, at time $T_1$ which is after $T_U$. The channel can start work using the new decimation factor $M_N$ ($M_N < M_O$) immediately. The second channel, CH2. is the next channel to finish, and it is loaded with $M_N$ but its output is not issued (or consumed) until $M_O + (2*M_N)$ periods of the input sample clock, $F_S$. Finally the output of the third channel is not output (or not used) until $(2*M_O) + M_N$ input periods of the sampling frequency $F_S$ have completed. As shown in FIG. 3, the example programmable decimator exhibits the new output data rate, $ODR_{NEW}$, corresponding to the decimation factor $M_N$ after a decimation factor delay that, in this embodiment, is three sample periods of the signal $ODR_{OLD}$, the output data rate corresponding to $M_O$.

The sinc filter, including the integrator stage 215 and combined decimator and differentiator stage 225, may be provided as individual components or within a single integrated circuit package. The sample rate converter may be provided as part of an analog to digital converter (ADC), as shown in FIG. 2. Alternatively, it may be provided as a component of some other signal processing element.

Figure 4:
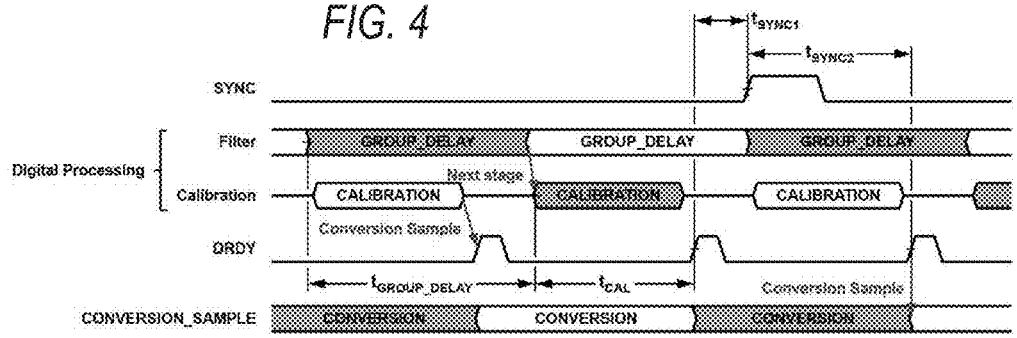
FIGS. 4, 5A and 5B are timing diagrams useful for describing embodiments disclosed herein.
Figure 6:
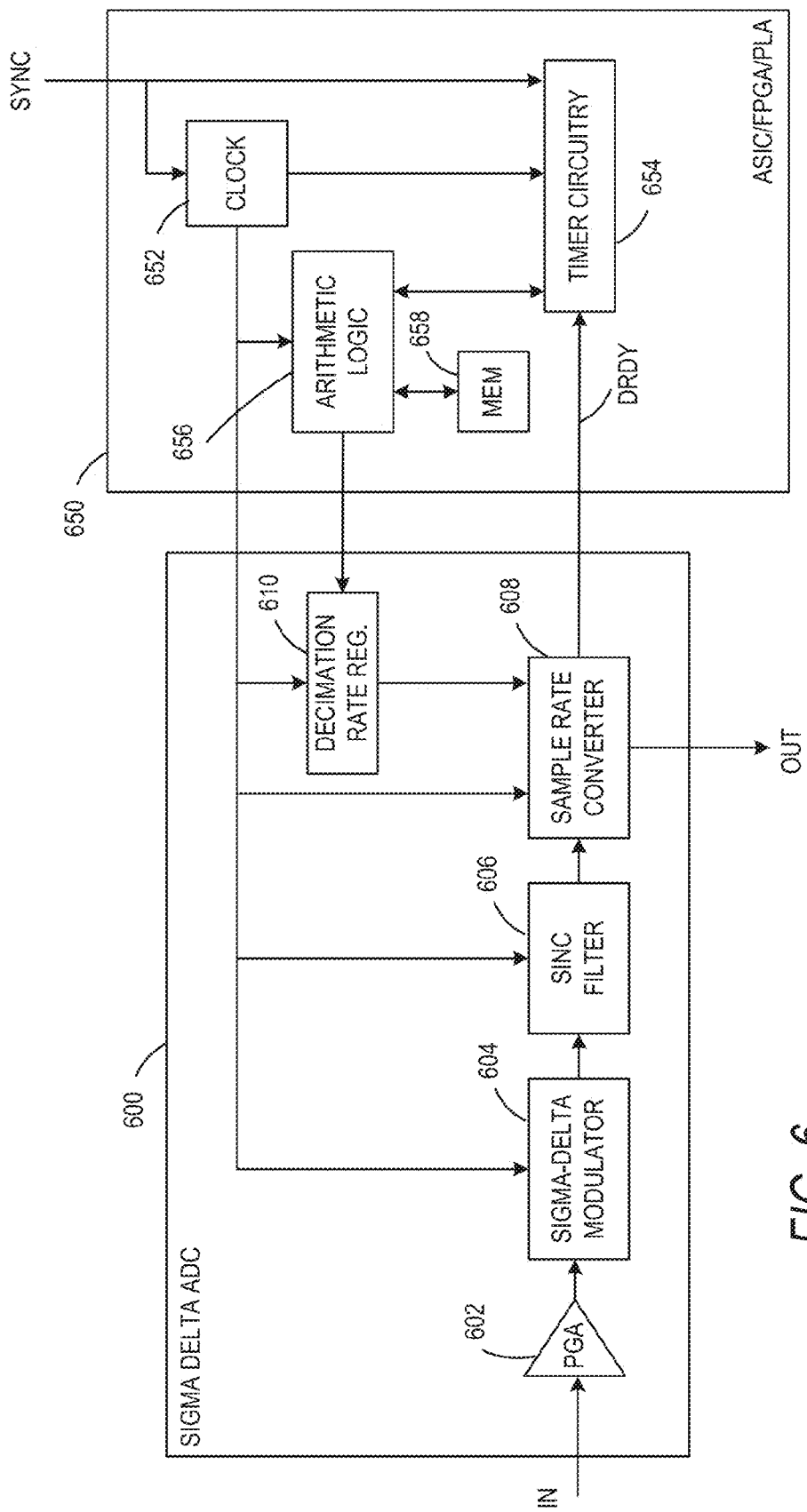
FIG. 6 is a block diagram of an example embodiment.
Figure 7:
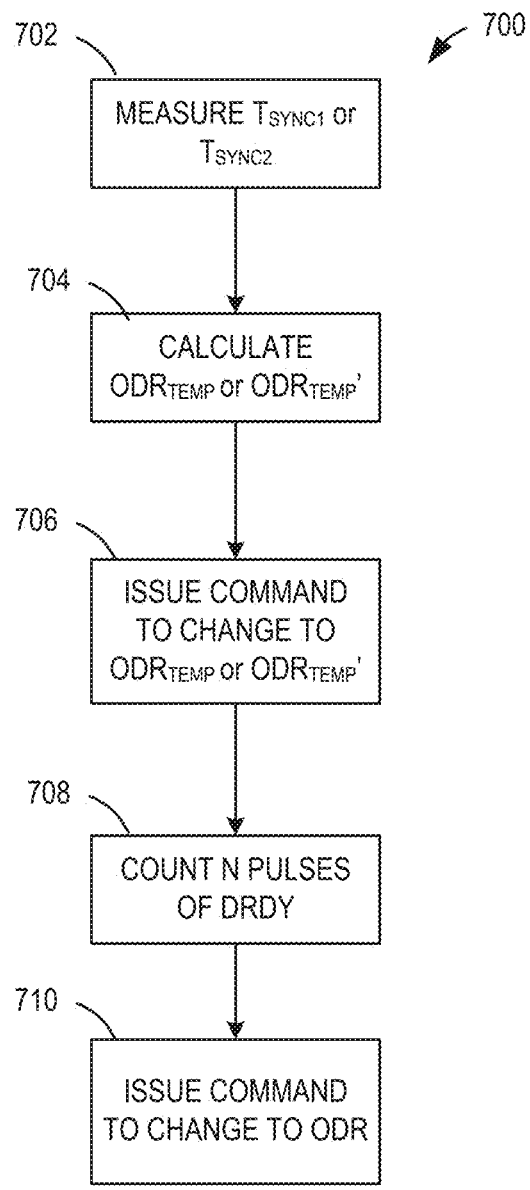
FIG. 7 is a flow-chart diagram which is useful for describing the operation of the embodiment shown in FIG. 6.

FIGS. 4 and 5 are timing diagrams that show how the sample rate converter may be used to quickly synchronize the output samples provided by a sigma-delta ADC of an acquisition board to a synchronization signal provided by a master board. Example circuitry to implement the synchronization operation is shown in FIG. 6 and FIG. 7 is a flow-chart that describes an example synchronization method that may be used with any sample rate converter.

FIG. 4 shows an example conversion process including time delays relevant to the embodiments disclosed below. The group delay time, $t_{GROUP\_DELAY}$, represents the processing time between when a sample is provided to the sinc filter and the filter produces the corresponding output data value. The calibration time, $t_{CAL}$, represents an amount of time used to compensate the output data value for gain and offset errors in the processing performed by the sigma-delta ADC and the filter. Both $t_{GROUP\_DELAY}$ and $t_{CAL}$ are characteristics of the device that includes the sample rate converter, in this case, the sinc filter. Each of the embodiments described below uses one of two synchronization time values, $t_{SYNC1}$ or $t_{SYNC2}$. The value $t_{SYNC1}$ represents an amount of time between the leading edge of the data ready pulse DRDY and the leading edge of the SYNC pulse when the SYNC pulse occurs after the DRDY pulse. The value $t_{SYNC2}$ represents an amount of time between the leading edge of the SYNC pulse and the DRDY pulse when the sync pulse occurs before the DRDY pulse.

In one example, when the system determines that pulses of DRDY are not synchronized to the SYNC pulse, the system temporarily changes the ODR of the programmable decimator to a value that tends to synchronize DRDY with the SYNC pulse and then changes the ODR back to its original value.

In one example embodiment, control circuitry coupled to the sigma-delta ADC uses the group delay, calibration and synchronization time values to determine the temporary ODR to be used to synchronize the sigma-delta ADC to the synchronization pulse. The temporary sampling rate, $ODR_{TEMP}$ or $ODR_{TEMP}'$, is given by equation (3), (4) when $T_{SYNC1}$ is used or by equation (5) when $T_{SYNC2}$ is used.

$$\text{If}(t_{CAL} + t_{SYNC1}) < \frac{t_{GROUP\_DELAY}}{2} \quad (3)$$

$$ODR_{TEMP} = \frac{ODR}{[1 + ODR(t_{SYNC1} + t_{CAL})/N]}$$

Else $$ODR_{TEMP} = \frac{ODR}{[1 - ODR(t_{GROUP\_DELAY} - t_{CAL} - t_{SYNC1})/N]} \quad (4)$$

$$ODR'_{TEMP} = \frac{ODR}{[1 + ODR(t_{SYNC2} - t_{CAL})/N]} \quad (5)$$

where N is the number of conversion sample intervals used by the sample-rate converter to adjust to a new output data rate. The temporary decimation rate is $1/ODR_{TEMP}$ or $1/ODR_{TEMP}'$. These values may be calculated directly by inverting equations (3), (4) and (5) as shown in equations (6), (7) and (8), respectively.

$$\text{If}(t_{CAL} + t_{SYNC1}) < \frac{t_{GROUPDELAY}}{2} \quad (6)$$

$$\frac{1}{ODR_{TEMP}} = \frac{1}{ODR} + \left[\frac{t_{CAL} + t_{SYNC1}}{N}\right]$$

Else $$\frac{1}{ODR_{TEMP}} = \frac{1}{ODR} - \left[\frac{t_{GROUPDELAY} - t_{CAL} - t_{SYNC1}}{N}\right] \quad (7)$$

$$\frac{1}{ODR'_{TEMP}} = \frac{1}{ODR} + \left[\frac{t_{SYNC2} - t_{CAL}}{N}\right] \quad (8)$$

When the sample-rate converter is implemented in a third-order sinc filter, N is equal to 3. From equation (3) it can be seen that $ODR_{TEMP}$ is greater than ODR when $t_{CAL}+t_{SYNC}$ is less than $t_{GROUP\_DELAY}/2$ while $ODR_{TEMP}'$ is less than ODR otherwise. Equations (3) and (4) represent corrections when the DRDY pulse occurs before the SYNC pulse and equation (5) represents a correction when the DRDY pulse occurs after the SYNC pulse. In one embodiment, the system uses the value $T_{SYNC1}$ when the interval between the leading edge of a pulse of the signal DRDY and the following SYNC pulse is less than one-half period of the signal DRDY. Otherwise, the system uses the value $T_{SYNC2}$ representing the interval between the leading edge of the SYNC pulse and the leading edge of the next pulse of the signal DRDY.

Figure 5A:
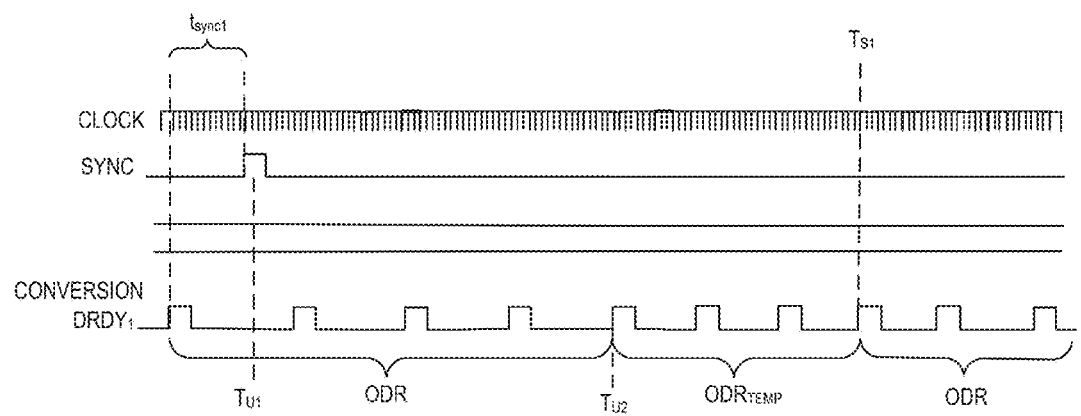
Figure 5B:
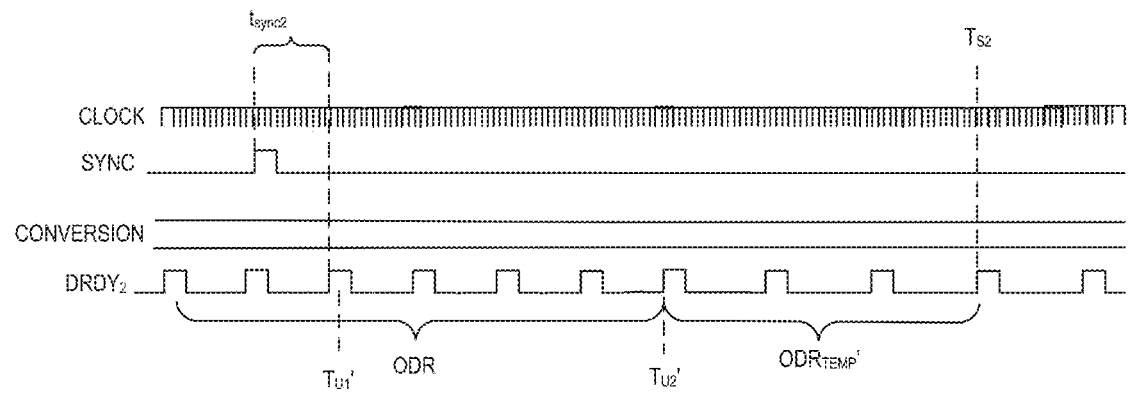

FIGS. 5A and 5B are timing diagrams showing example output sample synchronization sequences using the sample rate converter shown in FIG. 2. It is noted that the drawings are not to scale as the clock signal CLOCK, corresponding to the sampling clock signal $F_S$ has a much higher frequency than the output clock signal $DRDY_1$ or $DRDY_2$.

As described above, the interval $t_{SYNC1}$ shown in FIG. 5A represents the time between the leading edge of a pulse of the output clock signal DRDY and a leading edge of a pulse of the signal SYNC, when the SYNC pulse occurs after the DRDY pulse and when $t_{CAL}+t_{SYNC1}$ is greater than $t_{GROUP\_DELAY}/2$. In this instance, the example system temporarily increases the output data rate (i.e. $ODR_{TEMP}>ODR$) to align the $DRDY_1$ pulse with the SYNC signal. The system measures the interval $t_{SYNC1}$, calculates a value for $ODR_{TEMP}$, according to equation (4) or $1/ODR_{TEMP}$ according to equation (7), and, at time $TU_1$, signals the sample rate converter to switch to the $ODR_{TEMP}$ data rate. The system then waits until N conversion samples have been provided, i.e. N pulses of the signal $DRDY_1$ at the ODR data rate, and signals the sample rate converter to switch back to the ODR data rate at time $T_{U2}$.

As described above with reference to FIG. 3, this N output sample decimation factor delay is a characteristic of the example programmable decimator. The system then operates for N periods of the signal $DRDY_1$, at the sample rate $ODR_{TEMP}$ in response to the previous change request, until the time $T_{S1}$ when the output data rate returns to the ODR rate and the system is synchronized.

FIG. 5B shows the operation of the system when the SYNC pulse occurs before the $DRDY_2$ pulse or when the SYNC pulse occurs after the $DRDY_2$ pulse and $t_{CAL}+t_{SYNC}$ is less than $t_{GROUP\_DELAY}/2$. With reference equations (5) and (8), the system measures the interval $t_{SYNC2}$, calculates a value for $ODR_{TEMP}'$, according to equation (5) or $1/ODR_{TEMP}'$ according to equation (8), and signals the sample rate converter to switch to the $ODR_{TEMP}'$ data rate at time $T_{U1}'$. Because the SYNC signal in FIG. 5B occurs before the $DRDY_2$ pulse, the example system temporarily reduces the output data rate (i.e. $ODR_{TEMP}'<ODR$) to align the $DRDY_2$ pulse with the SYNC signal. The system then waits until N conversion samples have been provided, i.e. N pulses of the signal $DRDY_2$ at the ODR data rate, and signals the sample rate converter to switch back to the ODR data rate at time $T_{U2}'$. The system then operates for N periods of the signal $DRDY_2$, at the sample rate $ODR_{TEMP}'$, until the time $T_{S2}'$ when the output data rate returns to the ODR rate and the system is synchronized.

FIG. 6 is a block diagram of an example sigma-delta ADC device 600 including a sample rate converter 608 and a decimation register 610. The ADC 600 is coupled to a synchronization circuit 650 which synchronizes the output sample stream to the synchronization signal SYNC, as described above.

The ADC 600 receives an analog input signal IN at the input of a programmable gain amplifier (PGA) 602. The amplifier 602 amplifies or attenuates the analog input signal to be in a range compatible with the sigma-delta modulator 604. The sigma-delta modulator generates a stream of digital samples at the sample rate $F_S$. The samples are applied to a sinc filter 606 which processes the samples to remove noise. Filter 606 may include a sample rate converter 608, as described above with reference to FIG. 2. The output signal OUT of the sample rate converter 608 is the output signal of the sigma-delta ADC.

The sample rate converter 608 may also be separate from the sinc filter 606. In this configuration, the sinc filter 606 may operate at the input sample rate $F_S$. The sample rate converter 608 may include a programmable decimator that operates on digital samples provided by the sinc filter 606.

In either configuration, the sample rate converter 608 receives a decimation rate value from a decimation rate register 610. The register 610 is controlled by the synchronization circuit 650. The synchronization circuit 650 may be implemented separately from the sigma-delta ADC 600 in an application specific integrated circuit (ASIC), a field programmable gate array (FPGA), and/or a programmable logic array (PLA). Alternatively, the synchronization circuit 650 may be implemented in logic included in the sigma-delta ADC 600.

The example synchronization circuit 650 includes a clock signal generator 652, timer circuitry 654, arithmetic logic 656 and a memory 658. As shown in FIG. 6, the clock signal generator 652 is coupled to provide clock signals at the input sample rate $F_S$ to the sigma-delta ADC 600, to the timer circuitry 654, and to arithmetic logic 656. The timer circuitry 654 is also coupled to receive the output sample signal DRDY from the sample rate converter 608. Timer circuitry 654 determines the value of $t_{SYNC1}$ or $t_{SYNC2}$. The timer circuitry 654 may include a counter. In this embodiment, when the synchronization circuit uses $t_{SYNC1}$ to synchronize the ADC 600, the counter is configured to be reset by the leading edge of each pulse of the signal DRDY and to be read coincident with the leading edge of the SYNC signal pulse. When the synchronization circuit uses $t_{SYNC2}$ to synchronize the ADC 600, the counter is configured to be reset by the leading edge of each pulse of the signal SYNC and to be read coincident with the leading edge of the next successive pulse of the signal DRDY. This may be implemented, for example, by reading and resetting the counter at the leading edge of each pulse of the signal DRDY and at the leading edge of each pulse the SYNC signal. When the value read coincident with the SYNC pulse is less than one-half period of ODR, the value is used as the signal $t_{SYNC1}$, otherwise, the value read coincident with the next successive DRDY pulse is used as the signal $t_{SYNC2}$.

Alternatively, the clock circuitry 652 may include a counter that counts clock pulses to generate a system clock value. In this embodiment, the timer circuitry may store a value of the system clock value when the leading edge of each SYNC pulse occurs and at the occurrence of the leading edge of each pulse of the signal DRDY. In this embodiment, the timer circuitry may generate a difference between successive stored values. When the difference between the clock value stored at the leading edge of the DRDY pulse and the leading edge of the SYNC pulse is less than one-half period of ODR, that difference is used as the value $t_{SYNC1}$. When the difference is greater than or equal to one-half period of the signal DRDY, the system waits for the next DRDY pulse and uses the difference between the clock value coincident with the leading edge of the SYNC pulse and the clock value coincident with the leading edge of the next DRDY pulse as the value $t_{SYNC2}$.

The synchronization interval $t_{SYNC1}$ or $t_{SYNC2}$ is combined with stored values $t_{GROUP\_DELAY}$ and $t_{CAL}$ from the memory 658 to calculate the temporary decimation rate according to equations (6), (7) or (8) corresponding to $ODR_{TEMP}$ or $ODR_{TEMP}'$ as shown in equations (3), (4) or (5), respectively. When ODR is not a preset value, the arithmetic logic 656 reads the current decimation rate, corresponding to ODR, from the decimation rate register 610, stores the value into the memory 658 and transfers the value $ODR_{TEMP}$ to the decimation rate register 610. After transferring $ODR_{TEMP}$ to the decimation rate register 610, the arithmetic logic 656 configures the counter 654 to count N pulses of the signal DRDY. After counting the N pulses of the signal DRDY, the arithmetic logic 656 retrieves the decimation rate corresponding to ODR from the memory 658 and transfers it to the decimation rate register 610 or resets the decimation rate to its preset value. The sigma-delta ADC is synchronized to the signal SYNC after N pulses of the signal DRDY.

Although FIG. 6 shows the synchronization circuit 650 as dedicated hardware elements, it is contemplated that the synchronization functions may be performed in software on a processing element such as a digital signal processor, microprocessor or microcontroller (not shown) coupled to the sigma-delta ADC 600 in place of the synchronization circuit 650. FIG. 7 is a flowchart diagram of example program 700 to implement the synchronization function. At block 702, the program causes processing element to measure $t_{SYNC1}$ or $t_{SYNC2}$. This block may increment a counter internal to the processing element to count a number of clock pulses between the leading edge of the SYNC pulse and respective leading edges of pulses of the signal DRDY occurring before and after the SYNC pulse. Alternatively, as described above, the processing element may store the time of occurrence of the leading edge each pulse of the signal DRDY and the time of occurrence of the leading edge of each SYNC pulse. When the difference between the stored DRDY value and the newly-stored SYNC value is less than one-half period of the signal DRDY, that difference is used as the value $t_{SYNC1}$. Otherwise, the system uses the difference between the stored SYNC value and the stored value for the next DRDY pulse as the signal $t_{SYNC2}$. At block 704, the program causes the processing element to calculate $ODR_{TEMP}$ or $ODR_{TEMP}'$ according to equation (3), (4) or (5) or the corresponding decimation factor according to equations (6), (7) and (8), respectively and, at block 706, causes the programmable decimator to change the decimation factor to $ODR_{TEMP}$ or $ODR_{TEMP}'$. At block 708, the program causes the processing element to count N pulses of the signal DRDY and then, at block 710, to issue a command to change the decimation factor back to the factor corresponding to ODR. The sigma-delta ADC is synchronized after N pulses of the signal DRDY at $ODR_{TEMP}$ or $ODR_{TEMP}'$.

The software shown in FIG. 7 may be implemented in a non-transitory computer-readable medium, such as, without exclusion, a memory element coupled to the processing element or an electronic, magnetic or optical medium, such as a non-volatile memory, magnetic disk, compact disk (CD), digital versatile disk (DVD) configured to be used with the processing element.

As described above, it is possible to provide a synchronization mechanism for a sample rate converter that can be implemented using hardware and/or software and that allows for output data to be available throughout the synchronization process without settling considerations. Although several examples are described above, these examples are not intended to be limiting. The methods and apparatus described in this specification are limited only by the scope of the following claims.

The invention claimed is:

1. A method for synchronizing output samples of a device, including a programmable decimator, to a synchronization pulse, the method comprising:
   determining an interval between the synchronization pulse and a pulse of a signal indicating that output samples of the device are ready, the signal indicating that the output samples of the device are ready having a specified rate;
   in response to the interval, applying a temporary decimation factor to the programmable decimator to achieve a temporary output data rate, using the determined interval and a processing time of the device, to generate the output samples; and
   after a specified delay, applying a decimation factor to the programmable decimator to provide output samples at the specified rate.

2. The method of claim 1, further comprising determining the processing time and the interval based at least in part on one or more characteristics of the device.

3. The method of claim 2 wherein the device includes a sigma-delta modulator circuit having a filter and wherein the processing time includes a group delay of the filter.

4. The method of claim 3, wherein the filter includes an $N^{th}$ order sinc filter, where N is an integer, and wherein the specified delay includes N periods of the of the signal indicating that the output samples of the device are ready.

5. The method of claim 3, wherein the sigma-delta modulator is part of a sigma-delta analog-to-digital converter (ADC) circuit and the processing time includes a sum of the group delay of the filter and a calibration delay of the ADC and the filter.

6. The method of claim 3, further comprising:
   determining that the interval between the synchronization pulse and the signal indicating that output samples of the device are ready is less than or equal to one-half of the group delay of the filter and, in response to the determination, applying the decimation factor to the programmable decimator includes applying the decimation factor such that the temporary output data rate is greater than the specified rate.

7. The method of claim 3, further comprising:
   determining that the interval between the synchronization pulse and the signal indicating that output samples of the device are ready is greater than one-half of the group delay of the filter and, in response to the determination, applying the decimation factor to the programmable decimator includes applying the decimation factor such that the temporary output data rate is less than the specified rate.

8. The method of claim 1 wherein determining the interval between the synchronization pulse and the pulse of the signal indicating that output samples of the device are ready includes:
   counting pulses of an input clock signal by a counter generate a count output signal;
   receiving the count output signal as a first count value and resetting the counter responsive to a leading edge of the pulse of the signal indicating that output samples of the device are ready;
   receiving the count output signal as a second count value and resetting the counter responsive to a leading edge of the synchronization pulse; and
   responsive to the second count value indicating a time less than one half of a period of the signal indicating that output samples of the device are ready, determining the interval based on the second count value.

9. The method of claim 1 wherein determining the interval between the synchronization pulse and the pulse of the signal indicating that output samples of the device are ready includes:
   counting pulses of an input clock signal by a counter to generate a count output signal;
   receiving the count output signal as a first count value and resetting the counter responsive to a leading edge of the pulse of the signal indicating that output samples of the device are ready;
   receiving the count output signal as a second count value and resetting the counter responsive to a leading edge of the synchronization pulse; and
   responsive to the second count value indicating a time greater than one half of a period of the signal indicating that output samples of the device are ready, determining the interval based on the first count value.

10. An apparatus for synchronizing output samples of a device having a programmable decimator to a synchronization pulse, the apparatus comprising:
    circuitry configured to determine an interval between the synchronization pulse and a pulse of a signal indicating that output samples of the device are ready, the signal indicating that the output samples of the device are ready having a specified rate; and
    control circuitry configured to:
    apply a temporary decimation factor to the programmable decimator to achieve a temporary output data rate, wherein the temporary decimation factor is based on the determined interval and on a processing time of the device to generate the output samples; and
    after a specified delay, apply a decimation factor to the programmable decimator to change the output data rate to the specified rate.

11. The apparatus of claim 10 wherein the processing time is determined based at least in part on one or more characteristics of the device.

12. The apparatus of claim 11, wherein the device includes a sigma-delta modulator circuit having a filter and the processing time includes a group delay of the filter.

13. The apparatus of claim 12, wherein the filter is an Nth order-sine filter, where N is an integer, and wherein the specified delay includes N periods of the signal indicating that the output samples of the device are ready.

14. The apparatus of claim 12, wherein device includes a sigma-delta. analog-to-digital converter (ADC) including the sigma-delta modulator, and the processing time is a sum of the group delay of the filter and a calibration delay of the ADC and the filter.

15. The apparatus of claim 12, wherein the control circuitry is configured to apply the decimation factor such that the temporal)' output data rate is greater than the specified rate when the interval between the synchronization pulse and the signal indicating that output samples of the device are ready is less than or equal to one-half of the group delay of the filter.

16. The apparatus of claim 10, wherein the control circuitry is configured to apply the decimation factor such that the temporary output data rate is less than the specified rate when the interval between the synchronization pulse and the signal indicating that output samples of the device are ready is greater than one-half of the group delay of the filter.

17. The apparatus of claim 10 further comprising:
    a clock generator for generating an input clock signal for the programmable decimator; and
    timer circuitry including a counter configured to count clock pulses of the input clock signal to provide a count output signal, wherein the timer circuitry is configured to:
    receive the count output signal, the synchronization pulse, and the pulse of a signal indicating that output samples of the device are ready;
    store the count output signal as a first count value and reset the counter, responsive to the pulse of the signal indicating that output samples of the device are ready; and
    store the count output signal as a second count value and reset the counter, responsive to the synchronization pulse;
    wherein the apparatus includes circuitry configured to determine the interval based on the second count value when the second count value indicates a time less than one half of a period of the signal indicating that output samples of the device are ready.

18. The apparatus of claim 10 further comprising:
    a clock generator for generating an input clock signal for the programmable decimator; and
    timer circuitry including a counter configured to count clock pulses of the input clock signal to provide a count output signal. wherein the timer circuitry is configured to:
    receive the count output signal, the synchronization pulse, and the pulse of a signal indicating that output samples of the device are ready;
    store the count output signal as a first count value and reset the counter responsive to a the pulse of the signal indicating that output samples of the device are ready ; and
    store the count output signal as a second count value and reset the counter responsive to the synchronization pulse;
    wherein the apparatus includes circuitry configured to determine the interval based on the first count value when the first count value indicates a time greater than one half of a period of the signal indicating that output samples of the device are ready.

19. A non-transitory computer readable medium including program instructions that are configured to cause a processing element to synchronize output samples of a device to a synchronization pulse, the device including a programmable decimator, the program instructions being configured to cause the processing element to:

determine an interval between the synchronization pulse and a pulse of a signal indicating that output samples of the device are ready, the signal indicating that the output samples of the device are ready having a specified rate;

in response to the interval, apply a temporary decimation factor to the programmable decimator to achieve a temporary output data rate, using the determined interval and a processing time of the device, to generate the output samples; and after a specified delay, apply a decimation factor to the programmable decimator to provide output samples at the specified rate.

20. An apparatus for synchronizing output samples of a device, including a programmable decimator, to a synchronization pulse, the apparatus comprising:

means for determining an interval between the synchronization pulse and a pulse of a signal indicating that output samples of the device are ready, the signal indicating that the output samples of the device are ready having a specified rate determined from an initial decimation factor applied to the programmable decimator;

means for determining a temporary decimation factor based on the determined interval and a processing time of the device;

means for applying the temporary decimation factor to the programmable decimator to achieve a temporary output data rate; and means for applying the initial decimation factor to the programmable decimator after a specified delay to provide output samples at the specified rate.

* * * * *

UNITED STATES PATENT AND TRADEMARK OFFICE
CERTIFICATE OF CORRECTION

PATENT NO. : 10,097,200 B1  
APPLICATION NO. : 15/593981  
DATED : October 9, 2018  
INVENTOR(S) : Usach Merino et al.

Page 1 of 1

It is certified that error appears in the above-identified patent and that said Letters Patent is hereby corrected as shown below:

In the Claims

In Column 10, Line 46, in Claim 4, delete "of the of the" and insert --of the-- therefor In Column 11, Line 9, in Claim 8, before "generate", insert --to--

In Column 11, Line 62, in Claim 13, delete "Nth" and insert --$N^{th}$-- therefor In Column 11, Line 67, in Claim 14, delete "sigma-delta." and insert --sigma-delta-- therefor In Column 12, Line 6, in Claim 15, delete "temporal)'" and insert --temporary-- therefor In Column 12, Line 45, in Claim 18, delete "signal." and insert --signal,-- therefor In Column 12, Line 51, in Claim 18, after "responsive to", delete "a"

In Column 12, Line 53, in Claim 18, delete "ready ;" and insert --ready;-- therefor Signed and Sealed this  
Twenty-fifth Day of June, 2019

Andrei Iancu  
*Director of the United States Patent and Trademark Office*